(12) United States Patent
Xu et al.

(10) Patent No.: US 11,127,757 B2
(45) Date of Patent: *Sep. 21, 2021

(54) THREE-DIMENSIONAL MEMORY DEVICE WITH SOURCE STRUCTURE AND METHODS FOR FORMING THE SAME

(71) Applicant: YANGTZE MEMORY TECHNOLOGIES CO., LTD., Wuhan (CN)

(72) Inventors: Wenxiang Xu, Wuhan (CN); Wei Xu, Wuhan (CN); Pan Huang, Wuhan (CN); Ping Yan, Wuhan (CN); Zongliang Huo, Wuhan (CN); Wenbin Zhou, Wuhan (CN); Ji Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 49 days.

This patent is subject to a terminal disclaimer.

(21) Appl. No.: 16/655,167

(22) Filed: Oct. 16, 2019

(65) Prior Publication Data
US 2021/0050367 A1   Feb. 18, 2021

Related U.S. Application Data

(63) Continuation of application No. PCT/CN2019/100357, filed on Aug. 13, 2019.

(51) Int. Cl.
*H01L 27/11582* (2017.01)
*H01L 21/02* (2006.01)
(Continued)

(52) U.S. Cl.
CPC .. *H01L 27/11582* (2013.01); *H01L 21/02164* (2013.01); *H01L 21/31116* (2013.01);
(Continued)

(58) Field of Classification Search
CPC ......... H01L 27/11582; H01L 21/76834; H01L 21/31116; H01L 21/76877;
(Continued)

(56) References Cited

U.S. PATENT DOCUMENTS 9,443,868 B1    9/2016 Hu et al.
9,520,403 B2 *  12/2016 Ahn .................. H01L 27/11582
(Continued)

FOREIGN PATENT DOCUMENTS

CN    102544063 A    7/2012
CN    102760739 A    10/2012
(Continued)

OTHER PUBLICATIONS

International Search Report issued in corresponding International Application No. PCT/CN2019/100357, dated May 15, 2019, 5 pages.
(Continued)

*Primary Examiner* — Karen Kusumakar
(74) *Attorney, Agent, or Firm* — Bayes PLLC

(57) ABSTRACT

Embodiments of structure and methods for forming a three-dimensional (3D) memory device are provided. In an example, a 3D memory device includes a memory stack, a plurality of channel structures, and a source structure. The memory stack is over a substrate and includes interleaved a plurality of conductor layers and a plurality of insulating layers. The plurality of channel structures extend vertically in the memory stack. The source structure extend in the memory stack. The source structure includes a plurality of source contacts each in a respective insulating structure, and two adjacent ones of the plurality of source contacts are conductively connected to one another.

20 Claims, 10 Drawing Sheets

(51) Int. Cl.
*H01L 21/311* (2006.01)
*H01L 21/768* (2006.01)
*H01L 27/11565* (2017.01)

(52) U.S. Cl.
CPC .. *H01L 21/76802* (2013.01); *H01L 21/76831* (2013.01); *H01L 21/76834* (2013.01); *H01L 21/76877* (2013.01); *H01L 27/11565* (2013.01); *H01L 21/0228* (2013.01)

(58) Field of Classification Search
CPC ......... H01L 21/76831; H01L 21/02164; H01L 21/76802; H01L 27/11565; H01L 21/0228
See application file for complete search history.

(56) References Cited

U.S. PATENT DOCUMENTS

| | | |
|---|---|---|
| 2014/0342519 A1 | 11/2014 | Noh et al. |
| 2016/0079254 A1* | 3/2016 | Shimura ........... H01L 27/11568 257/324 |
| 2016/0329347 A1 | 11/2016 | Huo et al. |
| 2017/0025421 A1 | 1/2017 | Sakakibara et al. |
| 2017/0148810 A1 | 5/2017 | Kai et al. |
| 2018/0108673 A1 | 4/2018 | Lee |
| 2021/0028111 A1* | 1/2021 | Kai ................... H01L 27/11582 |
| 2021/0050366 A1 | 2/2021 | Huang et al. |
| 2021/0050367 A1 | 2/2021 | Xu et al. |
| 2021/0066461 A1 | 3/2021 | Xia et al. |

FOREIGN PATENT DOCUMENTS

| | | |
|---|---|---|
| CN | 106206593 A | 12/2016 |
| CN | 106856198 A | 6/2017 |
| CN | 107810554 A | 3/2018 |
| CN | 107958909 A | 4/2018 |
| CN | 109003983 A | 12/2018 |
| CN | 109690775 A | 4/2019 |
| CN | 109742083 A | 5/2019 |
| CN | 109844949 A | 6/2019 |
| CN | 110024126 A | 7/2019 |
| CN | 110088905 A | 8/2019 |
| CN | 110112134 A | 8/2019 |
| CN | 110211965 A | 9/2019 |
| KR | 20150116995 A | 10/2015 |
| TW | 201628130 A | 8/2016 |
| TW | 201834207 A | 9/2018 |
| WO | 2015200021 A1 | 12/2015 |

OTHER PUBLICATIONS

Written Opinion of the International Searching Authority issued in corresponding International Application No. PCT/CN2019/100357, dated May 15, 2019, 5 pages.
International Search Report issued in corresponding International Application No. PCT/CN2019/100349, dated May 9, 2020, 5 pages.
Written Opinion of the International Searching Authority issued in corresponding International Application No. PCT/CN2019/100349, dated May 9, 2019, 5 pages.
International Search Report issued in corresponding International Application No. PCT/CN2019/100350, dated May 9, 2019, 5 pages.
Written Opinion of the International Searching Authority issued in corresponding International Application No. PCT/CN2019/100350, dated May 9, 2019, 5 pages.

* cited by examiner

100

300

400

THREE-DIMENSIONAL MEMORY DEVICE WITH SOURCE STRUCTURE AND METHODS FOR FORMING THE SAME

CROSS-REFERENCE TO RELATED APPLICATIONS

This application is continuation of International Application No. PCT/CN2019/100357, filed on Aug. 13, 2019, entitled "THREE-DIMENSIONAL MEMORY DEVICE WITH SOURCE STRUCTURE AND METHODS FOR FORMING THE SAME," which is hereby incorporated by reference in its entirety. This application is also related to co-pending U.S. application Ser. No. 16/655,157, filed on even date, entitled "THREE-DIMENSIONAL MEMORY DEVICE WITH SOURCE STRUCTURE AND METHODS FOR FORMING THE SAME," and co-pending U.S. application Ser. No. 16/655,171, filed on even date, entitled "THREE-DIMENSIONAL MEMORY DEVICE WITH SOURCE STRUCTURE AND METHODS FOR FORMING THE SAME," all of which are hereby incorporated by reference in their entireties.

BACKGROUND

Embodiments of the present disclosure relate to three-dimensional (3D) memory devices having source structures of reduced resistance, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices are provided.

In one example, a 3D memory device includes a memory stack, a plurality of channel structures, and a source structure. The memory stack is over a substrate and includes interleaved a plurality of conductor layers and a plurality of insulating layers. The plurality of channel structures extend vertically in the memory stack. The source structure extend in the memory stack. The source structure includes a plurality of source contacts each in a respective insulating structure, and two adjacent ones of the plurality of source contacts are conductively connected to one another.

In another example, a 3D memory device includes a memory stack, a plurality of channel structures, and a plurality of source structures. The memory stack is over a substrate and includes interleaved a plurality of conductor layers and a plurality of insulating layers. The plurality of channel structures extend vertically in the memory stack. The plurality of source structures extend in parallel along a lateral direction in the memory stack. The plurality of source structures each includes a plurality of source contacts each in a respective insulating structure, a plurality of support structures each in contact with adjacent insulating structures along the lateral direction, and a connection layer conductively connected to at least two adjacent ones of the plurality of source contacts.

In a further example, a method for forming a 3D memory device includes a method for forming a 3D memory device includes the following operations. First, a cut structure is formed in a stack structure, the stack structure including interleaved a plurality of initial sacrificial layers and a plurality of initial insulating layers. Portions of the stack structure adjacent to the cut structure are removed to form a slit structure and an initial support structure, the initial support structure dividing the slit structure into a plurality of slit openings. A plurality of conductor portions are formed through the plurality of slit openings to form a support structure. A source contact is formed in each of the plurality of slit openings. A pair of first portions of a connection layer are formed in contact with and conductively connected to source contacts in adjacent ones of the plurality of slit openings. A second portion of the connection layer is formed in contact with and conductively to the pair of first portions of the connection layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
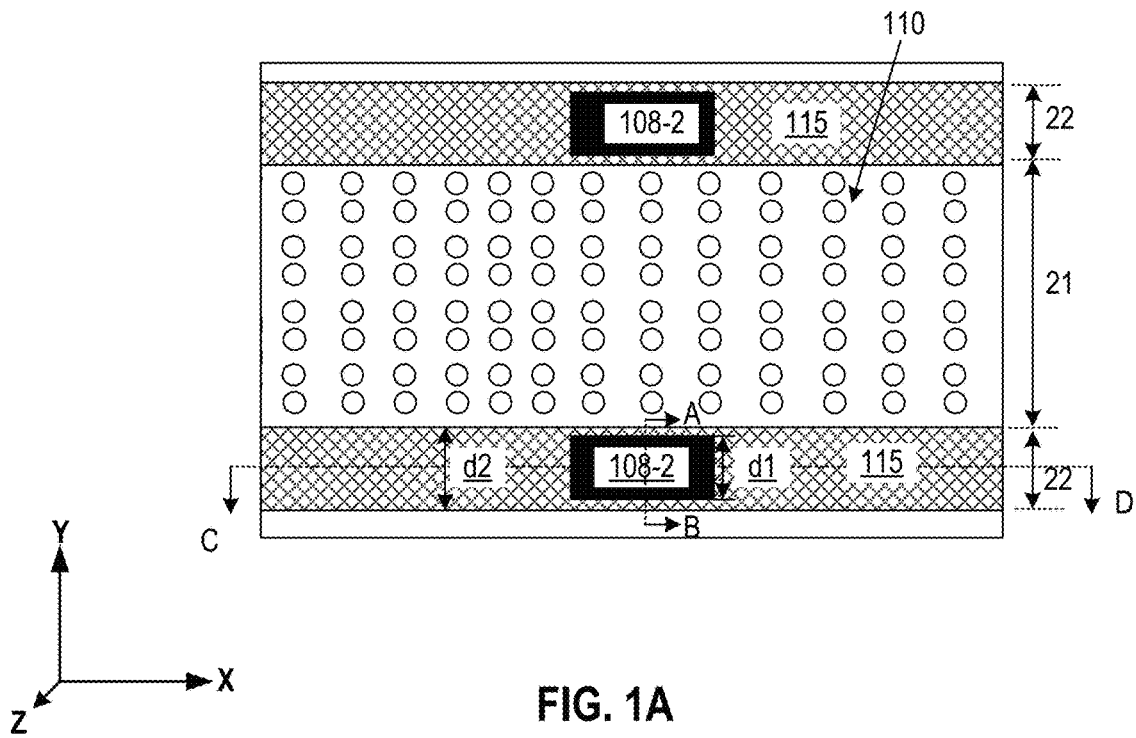
FIG. 1A illustrates a plan view of an exemplary 3D memory device having source structures of reduced resistance, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile, light-weighted, of low power consumption and good performance. Currently, planar NAND flash memory devices have reached its storage limit. To further increase the storage capacity and reduce the storage cost per bit, 3D NAND memory devices have been proposed. An existing 3D NAND memory device often includes a plurality of memory blocks. Adjacent memory blocks are often separated by a GLS, in which an array common source (ACS) is formed. In the fabrication method to form the existing 3D NAND memory device, due to an increased number of levels (or conductor/insulator pairs), the etching process to form GLSs become challenging. For example, the GLSs can be more susceptible to deformation, e.g., fluctuation of feature size, causing memory blocks neighboring the GLSs to deform or even collapse. The performance of the 3D NAND memory device can be affected.

Figure 8:
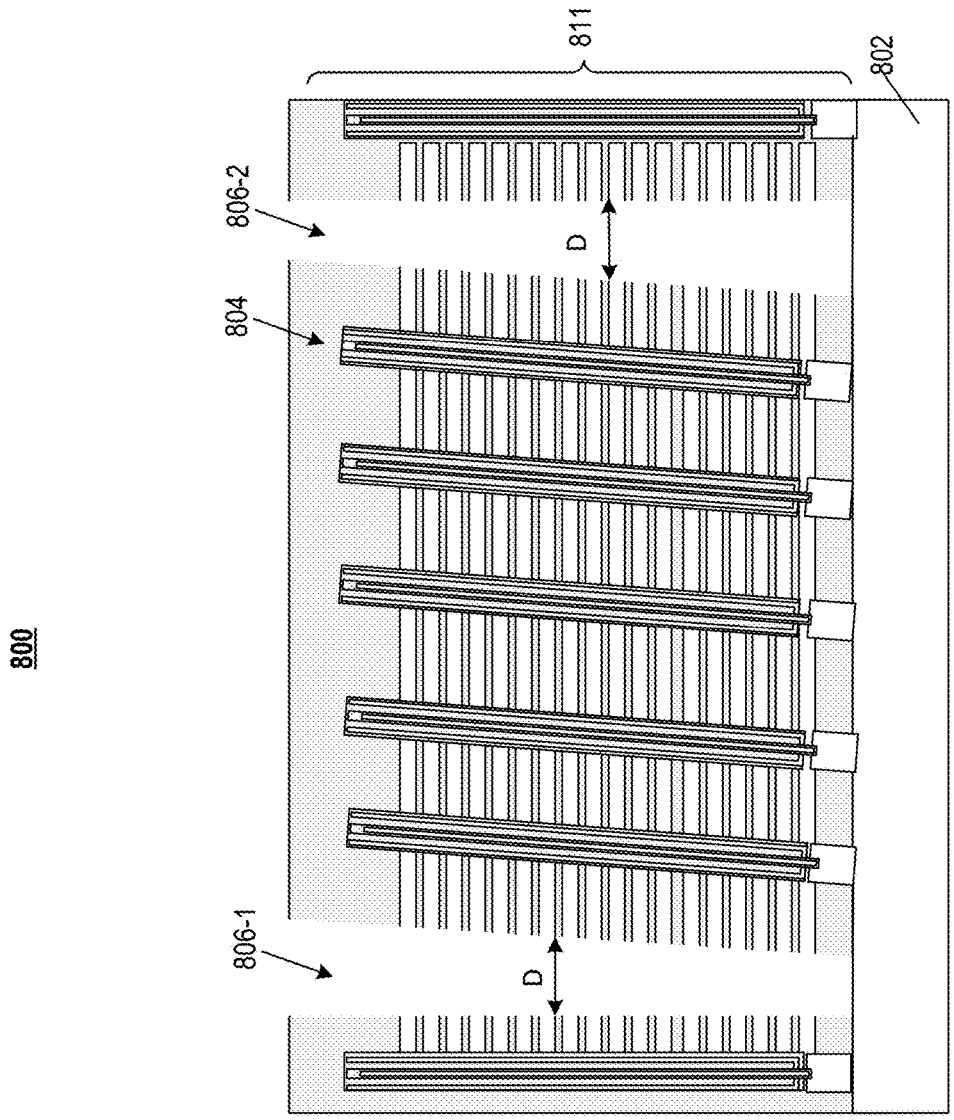
FIG. 8 illustrates a cross-sectional view of an existing 3D memory device with deformed gate line slits (GLSs).

FIG. 8 illustrates an existing 3D memory device 800 with deformed GLSs and a deformed memory block. As shown in FIG. 8, a memory stack 811 is formed over a substrate 802. A plurality of GLS, e.g., 806-1 and 806-2, extend through memory stack 811 to expose substrate 802. A plurality of channel structures 804 are arranged in a memory block between GLSs 806-1 and 806-2. Due to deformation, a lateral dimension, e.g., diameter D, of GLS (e.g., 806-1 or 806-2) varies along the vertical direction (e.g., the z-direction), causing the memory block and channel structures 804, to move from their desired position/orientation. These deformations can lead to photolithography misalignment and electrical leakage in subsequent fabrication processes that form ACSs in the GLSs.

The present disclosure provides 3D memory devices (e.g., 3D NAND memory devices) having source structures with reduced resistance, and methods for forming the 3D memory devices. A 3D memory device employs one or more support structures that divide a slit structure into a plurality of slit openings, in which source contacts are formed. The support structures are each in contact with adjacent memory blocks, providing support to the entire structure of the 3D memory device during the formation of conductor layers/portions and source contacts. The 3D memory device is then less susceptible to deformation or damages during the fabrication process.

In the 3D memory device, at least two adjacent source contacts are in contact with and conductively connected to one another through a connection layer, which includes a conductive material such as tungsten. One or more pairs of adjacent source contacts in a source structure can be in contact with and conductively connected together by the connection layer. Instead of applying a source voltage on each of the plurality of source contacts using a respective contact plug, the source voltage is applied on the source contacts (e.g., the source contacts that are in contact with connection layer) through the connection layer(s), reducing or eliminating the use of contact plugs. The resistance of the source structure can be reduced. The contact area between the connection layer and a source contact can be sufficiently large to further reduce the resistance of the source structure. In some embodiments, the connection layer is in contact with and conductively connected to all the source contacts in a source structure, further reducing the resistance of the source structure.

Figure 1B:
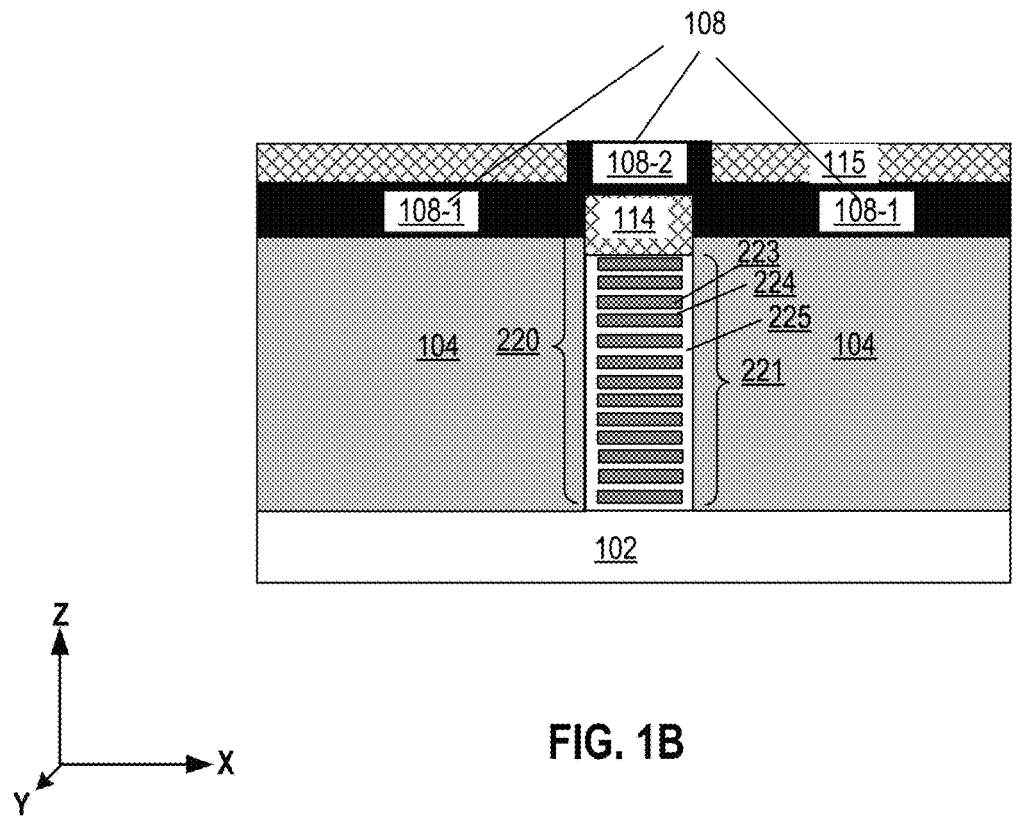
FIG. 1B illustrates a cross-sectional view of the 3D memory device illustrated in FIG. 1A along the C-D direction, according to some embodiments of the present disclosure.
Figure 1C:
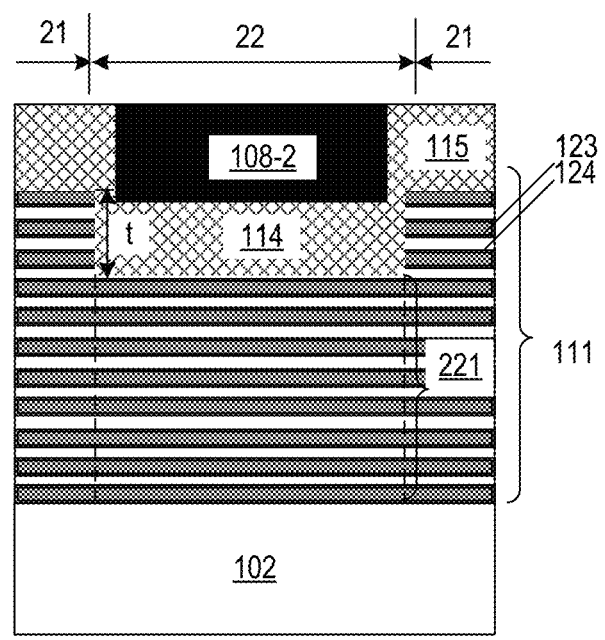
FIG. 1C illustrates a cross-sectional view of the 3D memory device illustrated in FIG. 1A along the A-B direction, according to some embodiments of the present disclosure.
Figure 1C:
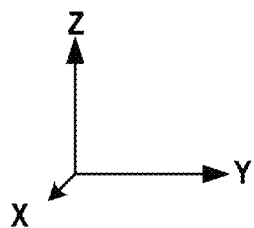

FIG. 1A illustrates a plan view of an exemplary 3D memory device 100, according to some embodiments. FIG. 1B illustrates a cross-sectional view of the 3D memory device 100 shown in FIG. 1A along the C-D direction. FIG. 1C illustrates a cross-sectional view of the 3D memory device 100 shown in FIG. 1A along the A-B direction. As shown in FIG. 1A, 3D memory device 100 may include a core region in which one or more, e.g., a pair of, source regions 22 extend along the x-direction. A source structure may be formed in each source region 22. One or more block regions 21, in which a plurality of memory cells are formed, may be between the pair of source regions 22. A memory block may be formed in each block region 21.

As shown in FIGS. 1A-1C, 3D memory device 100 may include a substrate 102, and a stack structure 111 over substrate 102. In block regions 21, stack structure 111 may include a plurality of conductor layers 123 and a plurality of insulating layers 124 interleaved over substrate 102. In block regions 21, stack structure 111 may also include a plurality of channel structures 110 extending through stack structure 111 into substrate 102 along a vertical direction (e.g., the z-direction). Each channel structure 110 may include an epitaxial portion at a bottom portion, a drain structure at a top portion, and a semiconductor channel between the epitaxial portion and the drain structure. The semiconductor channel may include a memory film, a semiconductor layer, and a dielectric core. The epitaxial portion may be in contact with and conductively connected to substrate 102. The semiconductor channel may be in contact with and conductively connected to the drain structure and the epitaxial portion. A plurality of memory cells may be formed by the semiconductor channels and control conductor layers.

A source structure may be formed in source region 22 to extend along the x-direction. The source structure may include a plurality of source contacts 104 each in a respective insulating structure (not shown). Source contacts 104 and the respective insulating structures formed in one source region 22 (e.g., within the same source structure) may be aligned along the x-direction. The source structures may each extend vertically through stack structure 111 and contact substrate 102. A source voltage can be applied to the memory cells through the source structure and substrate 102.

3D memory device 100 may include one or more support structures 220 aligned along the x-direction and dividing a source structure into the plurality of source contacts 104 each in the respective insulating structure. In some embodiments, support structure 220 includes a cut structure 114 and a portion stack 221 between cut structure 114 and substrate 102. Portion stack 221 may include interleaved a plurality of conductor portions 223 and insulating portions 224 over substrate 102. Each support structure 220 may be in contact with adjacent memory blocks (or block regions 21) along the y-direction, and in contact with adjacent insulating structures of the respective source structure along the x-direction. Support structure 220 may provide support to 3D memory device 100 during the formation of the source structures and conductor layers 123. 3D memory device 100 may further include a connection layer 108 in contact with and conductively connected to at least two adjacent source contacts 104, and a dielectric cap layer 115 partially covering connection layer 108. Dielectric cap layer 115 may cover portions of connection layer 108 that is in contact with and covering source contacts 104, and expose the portions of connection layer 108 between adjacent source contacts 104. Contact plugs (not shown) for conductively applying a source voltage can be formed on the exposed portions of connection layer 108. In some embodiments, connection layer 108 is over and in contact with all the source contacts 104 in a source structure so that source voltage can be applied on all the source contacts 104 of the source structure through connection layer 108. The resistance of the source structure can be reduced compared to applying the source voltage onto each source contact 104 using a respective contact plug. In some embodiments, dielectric cap layer 115 also covers at least a portion of block region 21. In some embodiments, dielectric cap layer 115 covers all channel structures 110 in block region 21. Contact plugs (not shown) for conductively applying a drain voltage can be formed extending through dielectric cap layer 115 and form contact with channel structures 110. For ease of illustration, coverage of dielectric cap layer 115 in block region 21 is not depicted. Details of each structure illustrated in FIGS. 1A-1C are described below.

Substrate 102 can include silicon (e.g., single crystalline silicon), silicon germanium (SiGe), gallium arsenide (GaAs), germanium (Ge), silicon on insulator (SOD, germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. In some embodiments, substrate 102 includes silicon.

Channel structures 110 may form an array and may each extend vertically above substrate 102. Channel structure 110 may extend through a plurality of pairs each including a conductor layer 123 and an insulating layer 124 (referred to herein as "conductor/insulating layer pairs"). At least on one side along a horizontal direction (e.g., x-direction and/or y-direction), stack structure 111 can include a staircase structure (not shown). The number of the conductor/insulating layer pairs in stack structure 111 (e.g., 32, 64, 96, or 128) determines the number of memory cells in 3D memory device 100. In some embodiments, conductor layers 123 and insulating layers 124 in stack structure 111 are alternatingly arranged along the vertical direction in block regions 21. Conductor layers 123 can include conductive materials including, but not limited to, tungsten (W), cobalt (Co), copper (Cu), aluminum (Al), polysilicon, doped silicon, silicides, or any combination thereof. Insulating layers 124 can include dielectric materials including, but not limited to, silicon oxide, silicon nitride, silicon oxynitride, or any combination thereof. In some embodiments, conductor layers 123 may include a top conductor layer having a plurality of top select conductor layers, and a bottom conductor layer having a plurality of bottom select conductor layers. The top select conductor layers may function as the top select gate electrodes, and the bottom select conductor layers may function as the bottom select gate electrodes. Conductor layers 123 between the top and bottom conductor layers may function as select gate electrodes and form memory cells with intersecting channel structures 110. Top select gate electrodes and bottom select gate electrodes can respectively be applied with desired voltages to select a desired memory block/finger/page.

Channel structure 110 can include a semiconductor channel extending vertically through stack structure 111. The semiconductor channel can include a channel hole filled with a channel-forming structure, e.g., semiconductor materials (e.g., as a semiconductor layer) and dielectric materials (e.g., as a memory film). In some embodiments, the semiconductor layer includes silicon, such as amorphous silicon, polysilicon, or single crystalline silicon. In some embodiments, the memory film is a composite layer including a tunneling layer, a memory layer (also known as a "charge trap layer"), and a blocking layer. The remaining space of the channel hole of semiconductor channel can be partially or fully filled with a dielectric core including dielectric materials, such as silicon oxide. The semiconductor channel can have a cylinder shape (e.g., a pillar shape). The dielectric core, semiconductor layer, the tunneling layer, the memory layer, and the blocking layer are arranged radially from the center toward the outer surface of the pillar in this order, according to some embodiments. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 110 further includes an epitaxial portion (e.g., a semiconductor plug) in the lower portion (e.g., at the lower end of bottom) of channel structure 110. As used herein, the "upper end" of a component (e.g., channel structure 110) is the end farther away from substrate 102 in the vertical direction, and the "lower end" of the component (e.g., channel structure 110) is the end closer to substrate 102 in the vertical direction when substrate 102 is positioned in the lowest plane of 3D memory device 100. The epitaxial portion can include a semiconductor material, such as silicon, which is epitaxially grown from substrate 102 in any suitable directions. It is understood that in some embodiments, the epitaxial portion includes single crystalline silicon, the same material as substrate 102. In other words, the epitaxial portion can include an epitaxially-grown semiconductor layer grown from substrate 102. The epitaxial portion can also include a different material than substrate 102. In some embodiments, the epitaxial portion includes at least one of silicon, germanium, and silicon germanium. In some embodiments, part of the epitaxial portion is above the top surface of substrate 102 and in contact with semiconductor channel. The epitaxial portion may be conductively connected to semiconductor channel. In some embodiments, a top surface of the epitaxial portion is located between a top surface and a bottom surface of a bottom insulating layer 124 (e.g., the insulating layer at the bottom of stack structure 111).

In some embodiments, channel structure 110 further includes a drain structure (e.g., channel plug) in the upper portion (e.g., at the upper end) of channel structure 110. The drain structure can be in contact with the upper end of a semiconductor channel and may be conductively connected to the semiconductor channel. The drain structure can include semiconductor materials (e.g., polysilicon) or conductive materials (e.g., metals). In some embodiments, the drain structure includes an opening filled with Ti/TiN or Ta/TaN as an adhesion layer and tungsten as a conductor material. By covering the upper end of semiconductor channel during the fabrication of 3D memory device 100, the drain structure can function as an etch stop layer to prevent etching of dielectrics filled in the semiconductor channel, such as silicon oxide and silicon nitride.

As shown in FIGS. 1A-1C, a source structure can be formed in source region 22. The source structure, aligned along the x-direction, may include a plurality of source contacts 104 each in a respective insulating structure (not shown). Each source contact 104 may be in contact with and conductively connected to substrate 102. The insulating structure may insulate the respective source contact 104 from conductor layers 123 in adjacent block regions 21. In some embodiments, source contact 104 includes at least one of polysilicon, aluminum, cobalt, copper, and silicides. The insulating structure can include a suitable dielectric material, such as one or more of silicon oxide, silicon nitride, and silicon oxynitride.

One or more support structures 220 may be distributed in a respective source structure along the x-direction. In some embodiments, the support structures 220 divides the respective source structure into a plurality of source contacts 104, each in the respective insulating structure (e.g., the insulating structure surrounding source contact 104). In some embodiments, each source contact 104 and the respective insulating structure is separated from another source contact 104 and another insulating structure by a support structure 220. Support structure 220, in contact with portions of stack structure 111 in adjacent block regions 21, may include cut structure 114 and portion stack 221 under cut structure 114. In some embodiments, portion stack 221 includes interleaved a plurality of conductor portions 223 and a plurality of insulating portions 224. In some embodiments, a width of cut structure 114 along the y-direction may be greater than, equal to, or less than a total width of source contact 104 and the respective insulating structure (e.g., a width of the source structure). In some embodiments, the width of cut structure 114 along the y-direction is equal to or less than the width of the source structure. In some embodiments, a thickness t of cut structure 114 along the z-direction may be between two conductor/insulating pairs (i.e., interleaved two conductor layers 123 and two insulating layers 124) and four conductor/insulating pairs (i.e., interleaved four conductor layers 123 and four insulating layers 124). Cut structure 114 may be in contact with a plurality of interleaved conductor layers 123 and insulating layers 124 in adjacent block regions 21. Conductor portions 223 and insulating portions 224 may respectively be in contact with corresponding conductor layers 123 and insulating layers 124 of the same level in adjacent block regions 21. In some embodiments, a top surface of a source contact 104 is lower than a top surface of support structure 220 along the z-direction. In some embodiments, of the same source structure, top surfaces of all source contacts 104 are lower than top surfaces of all support structures 220. In some embodiments, support structure 220 includes a spacer layer 225 under cut structure 114 and surrounding portion stack 221. Spacer layer 225 may provide further insulation between portion stack 221 and adjacent source contacts 104.

Each source structure may further include connection layer 108 over and in contact with at least two adjacent source contacts 104. For example, connection layer 108 may be in contact with and conductively connected to one or more pairs of adjacent source contacts 104. Connection layer 108 may be conductively connected to the source contacts 104 with which it's in contact. In some embodiments, connection layer 108 may partially or fully cover source contacts 104 to which it's in contact with. As shown in FIGS. 1A-1C, connection layer 108 may be over two adjacent source contacts 104 and the support structure 220 between the two adjacent source contacts 104. For example, connection layer 108 may partially or fully cover two adjacent source contacts 104 and the support structure 220 between the two adjacent source contacts 104. The portion of connection layer 108 in contact with and conductively connected to source contact 104 may be referred to as a first portion 108-1 of connection layer 108. The portion of connection layer 108 in contact with support structure 220 may be referred to as a second portion 108-2 of connection layer 108. In some embodiments, second portion 108-2 of connection layer 108 may be in contact with and conductively connected to a pair of first portions 108-1, e.g., adjacent first portions 108-1 on both sides of second portion 108-2 along the x-direction. In some embodiments, connection layer 108 may include a plurality of first portions 108-1 and a plurality of second portions 108-2 in contact with and conductively connected to one another along the x-direction. In some embodiments, top surfaces of second portions 108-2 of connection layer 108 may be higher than top surfaces of first portions 108-1 of connection layer 108.

In some embodiments, connection layer 108 may include more than one segment, each including at least one second portion 108-2 and a plurality of first portions 108-1 in contact with one another. Each segment may be over and in contact with one or more pairs of adjacent source contacts 104 of the source structure. For example, the one or more pairs of adjacent source contacts 104, connected to different segments of connection layer 108, may be separated by one or more source contacts 104 that are not in contact with connection layer 108. The specific number of segments in connection layer 108 should be determined based on the design and/or fabrication of 3D memory device 100 and should not be limited by the embodiments of the present disclosure. In some embodiments, connection layer 108 may be over and in contact with all source contacts 104 in the respective source structure. A source voltage may be applied on second portions 108-2 of the source structure so the all source contacts 104 connected to connection layer 108 can be applied with the source voltage.

In some embodiments, a width of connection layer 108 (or its segments, if any) along the y-direction may vary, depending on the design and/or fabrication process of 3D memory device 100. In some embodiments, connection layer 108 may partially cover the source contacts 104 underneath. That is, the width of connection layer 108 along the y-direction is equal to or less than the width of the source structure along the y-direction. In some embodiments, dielectric cap layer 115 may cover first portions 108-1 of connection layer 108 and expose second portions 108-2 of connection layer. A width d1 of second portion 108-2 of connection layer 108 may be less than or equal to a width d2 of dielectric cap layer 115 along the y-direction. In some embodiments, width d1 is less than width d2 so dielectric cap layer 115 can insulate second portion 108-2 from surroundings structures and/or devices along lateral directions (e.g., in the x-y plane). In some embodiments, conductive plugs (now shown, for applying a source voltage on connection layer 108) are formed on second portions 108-2. In some embodiments, dielectric cap layer 115 may be partially located in block regions 21. In some embodiments, dielectric cap layer 115 covers all channel structures 110 in block region 21. Contact plugs (not shown) for conductively applying a drain voltage can subsequently be formed extending through dielectric cap layer 115 and form contact with channel structures 110.

In some embodiments, cut structure 114 includes a suitable material that is different from the sacrificial layers. During the gate replacement process to form conductor layers 123 and conductor portions 223, cut structure 114 may retain from the etching of the sacrificial layers. In some embodiments, cut structure 114 includes one or more of silicon oxide, silicon nitride, and/or silicon oxynitride. In some embodiments, conductor portions 223 may include the same material as conductor layers 123 in adjacent block regions 21, and insulating portions 224 may include the same material as insulating layers 124 in adjacent block regions 21. For example, conductor portions 223 may include one or more of tungsten, aluminum, cobalt, copper, polysilicon, and silicides, and insulating portions 224 may include one or more of silicon oxide, silicon nitride, and silicon oxynitride. In some embodiments, connection layer 108 includes one or more of tungsten, aluminum, cobalt, copper, polysilicon, and silicides. In some embodiments, source contact 104 includes polysilicon, and connection layer 108 includes tungsten. In some embodiments, dielectric cap layer 115 includes silicon oxide. In some embodiments, 3D memory device 100 includes an adhesion layer, e.g., TiN, between source contact 104 and connection layer 108 to improve the adhesion and/or conductivity between source contact 104 and connection layer 108. In some embodiments, 3D memory device 100 includes another adhesion layer, e.g., TiN, between the respective insulating structure of source contact 104 and support structure 220 to improve the adhesion between the insulating structure and support structure 220.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 7A:
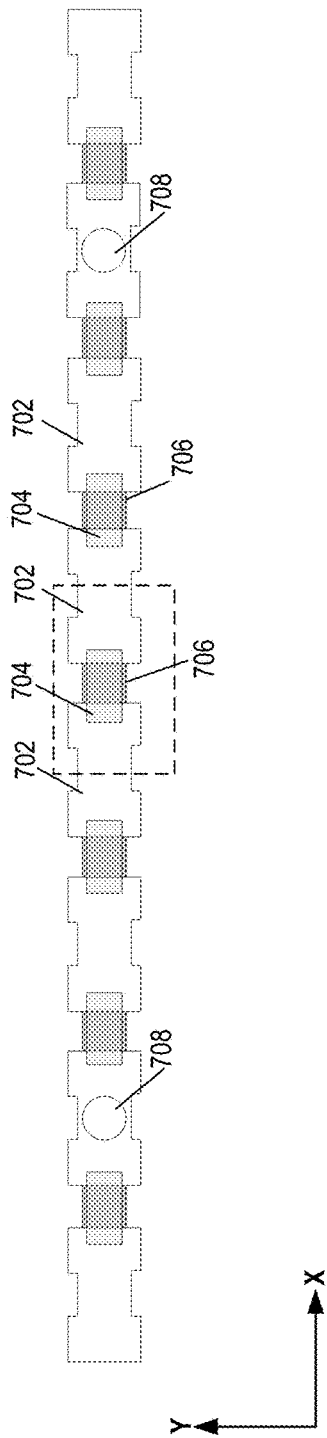
FIG. 7A illustrates a plan view of an exemplary pattern set for forming various structures in a fabrication process for forming a 3D memory device, according to some embodiments of the present disclosure.
Figure 7B:
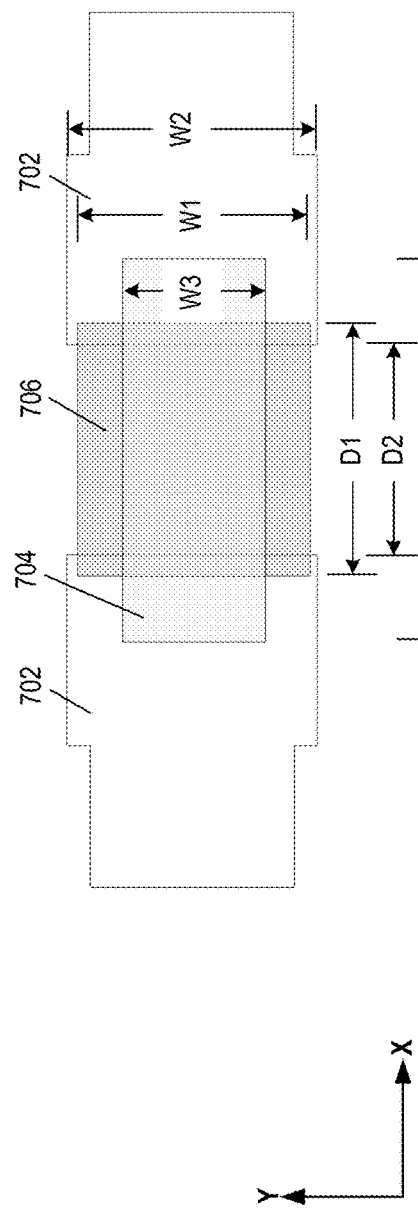
FIG. 7B illustrates an enlarged view of a portion of the pattern set shown in FIG. 7A, according to some embodiments of the present disclosure.

FIG. 7A illustrates an exemplary pattern set 700 for forming the etch masks used in the fabrication process. FIG. 7B illustrates an enlarged view of a unit 750 of the pattern set. Patterns in pattern set 700 may be used in different stages of a fabrication process to form 3D memory device 100. In various embodiments, depending on the types of photoresist used in the patterning processes, patterns in pattern set 700 may each be a part of an etch mask or a pattern for determining an etch mask. For example, if a negative photoresist is used for patterning, the patterns in pattern set 700 may be used as parts of etch masks; if a positive photoresist is used for patterning, the patterns in pattern set 700 may be complementary patterns for determining etch masks. It should be noted that the shapes, dimensions, and ratios shown in FIGS. 7A and 7B are for illustrative purposes and are not to scale.

As shown in FIG. 7A, pattern set 700 includes patterns 702, 704, 706, and 708. Specifically, pattern 702 may be used for patterning slit openings of a slit structure, pattern 704 may be used for patterning connection layer 108, pattern 706 may be used for patterning cut structure 114, and pattern 708 may be used for forming contact plugs in contact with and conductively connected to connection layer 108 and a peripheral circuit. Pattern set 700 may include a plurality of repeating units, e.g., 750, for the formation of cut structure 114, the slit openings, and connection layer 108. The dimensions of patterns 702, 704, and 706 may be determined based on the fabrication processes and should not be limited by the embodiments of the present disclosure.

FIG. 7B illustrates a repeating unit 750 that shows the details, e.g., coverage, of each pattern. Depending on the fabrication process, if cut structure 114 is used as an etch mask to form the slit openings, a width W1 of pattern 706 along the y-direction may be equal to or greater than a width of the slit openings so that the subsequently-formed support structure 220 is in contact with block regions 21. If a separate etch mask, e.g., pattern 702 is used as an etch mask to form the slit openings, width W1 of pattern 706 may be less than, equal to, or greater than width W2 of pattern 702; and a length D1 of pattern 706 may be greater than or equal to a length D2 between the two parts of pattern 702 so that the two parts of pattern 702 can both overlap with pattern 706 to ensure the slit openings and support structure 220 have desired dimensions. A width W3 of pattern 704 may be less than or equal to a width W1 of pattern 706 to ensure connection layer 108 is effectively confined/insulated by the subsequently-formed dielectric cap layer 115. A length D3 of pattern 704 may be equal to or greater than length D2 and length D1, respectively, to ensure sufficient areas of first portions 108-1 of connection layer 108 are exposed so second portion 108-2 of connection layer 108 can have sufficient contact area with first portions 108-1 of connection layer 108. In some embodiments, W3<W1<W2, and D2<D1<D3. The sequence to apply the patterns may be described in the fabrication process for forming 3D memory device 100 below.

Figure 9:
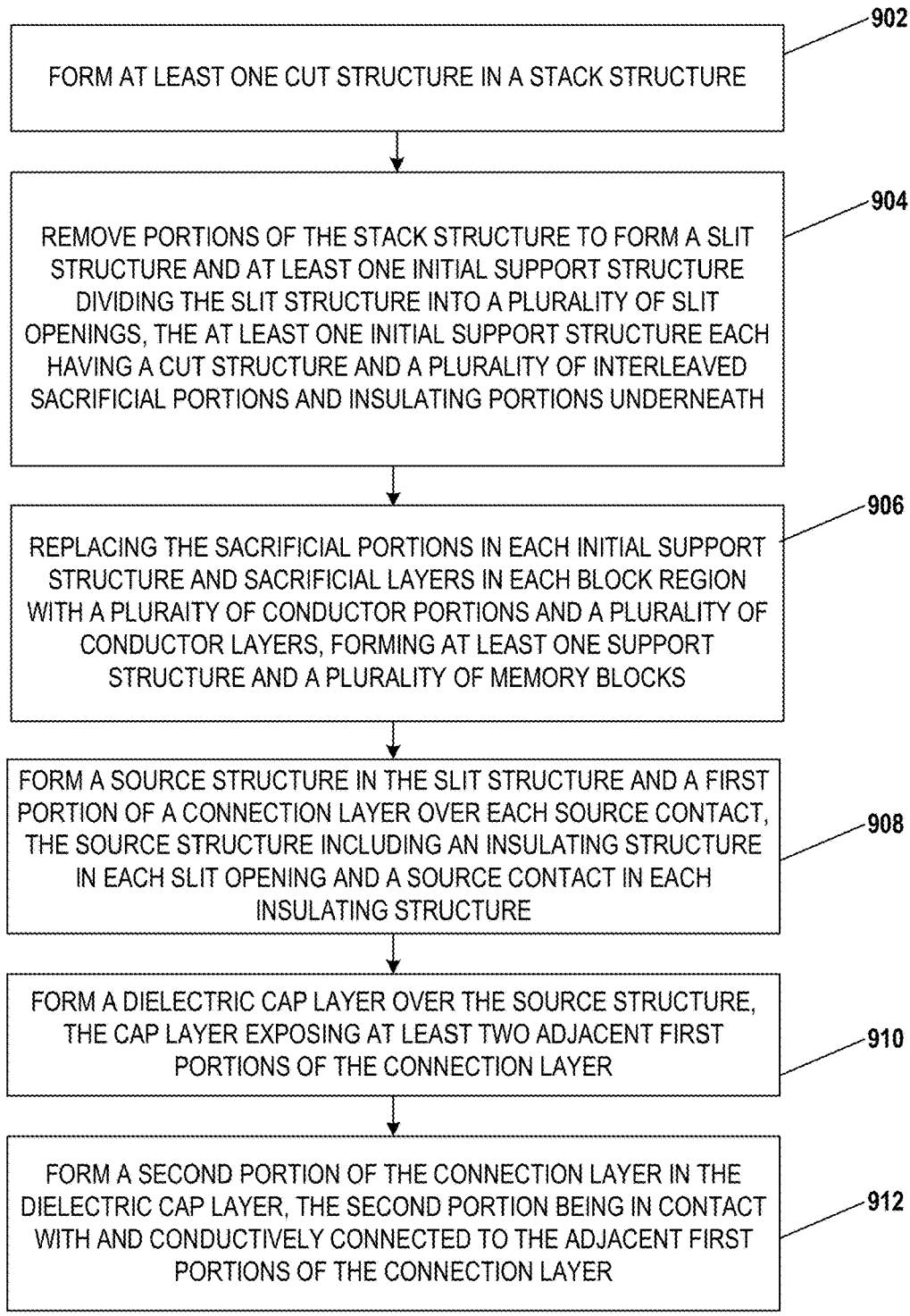
FIG. 9 illustrates a flowchart of an exemplary fabrication process for forming a 3D memory device having source structures of reduced resistance, according to some embodiments of the present disclosure.

FIGS. 2-6 illustrate a fabrication process to form 3D memory device 100, and FIG. 9 illustrates a flowchart 900 of the fabrication process, according to some embodiments. For ease of illustration, FIGS. 7A and 7B are illustrated together with FIGS. 2-6 to describe the fabrication process.

Figure 2A:
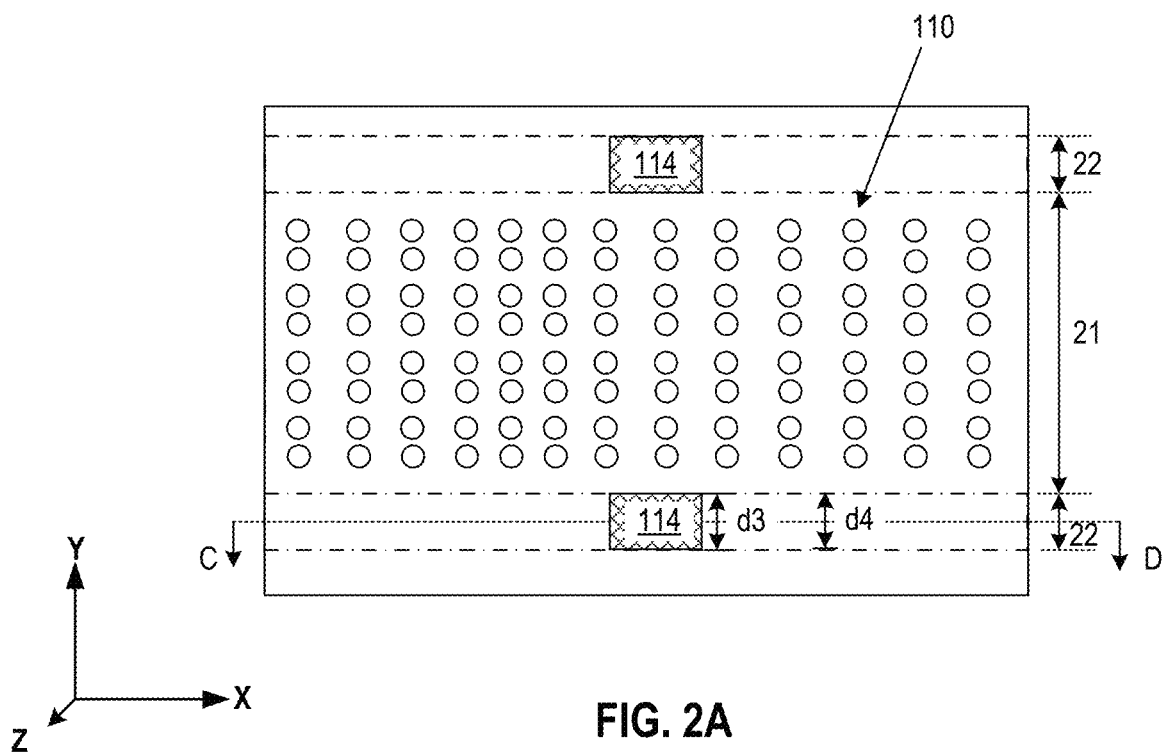
FIG. 2A illustrates a plan view of an exemplary 3D memory device at one stage of a fabrication process, according to some embodiments of the present disclosure.
Figure 2B:
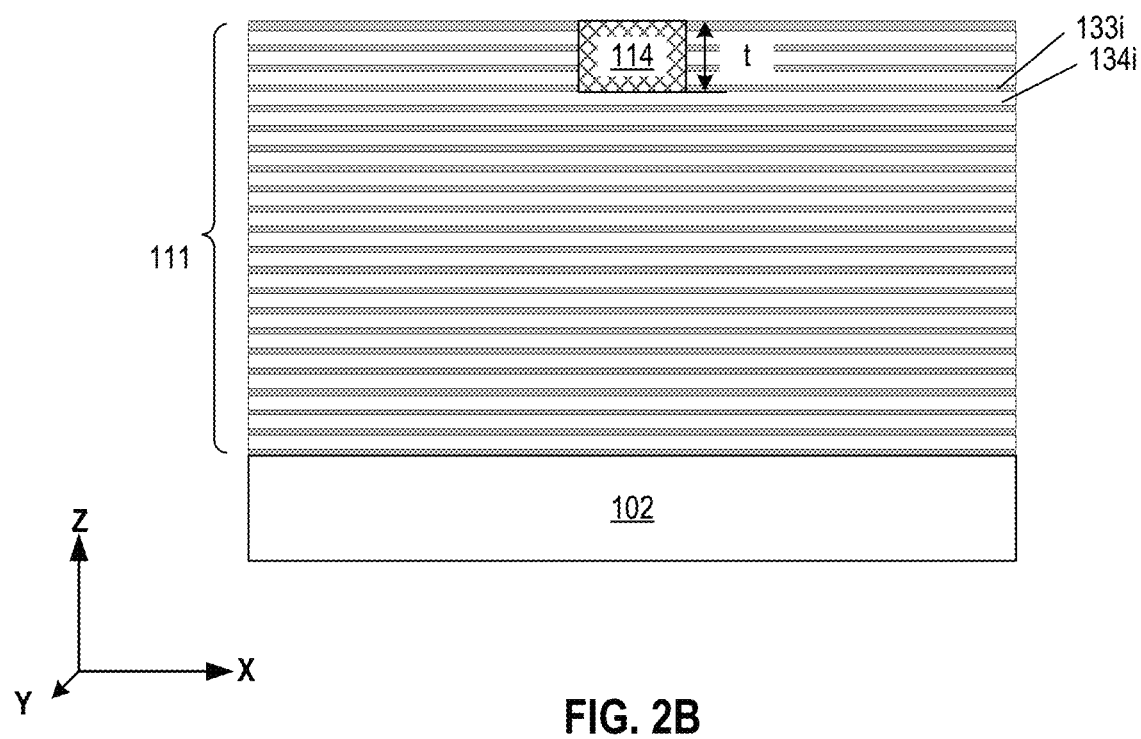
FIG. 2B illustrates a cross-sectional view of the 3D memory device illustrated in FIG. 2A along the C-D direction, according to some embodiments of the present disclosure.

At the beginning of the process, at least one cut structure is formed in a stack structure (Operation 902). FIGS. 2A and 2B illustrate a corresponding structure 200.

As shown in FIGS. 2A and 2B, a cut structure 114 is formed in a stack structure 111. Stack structure 111 may have a dielectric stack of interleaved initial sacrificial layers 133i and initial insulating layers 134i formed over a substrate 102. Initial sacrificial layers 133i may be used for subsequent formation of conductor layers 123. Initial insulating layers 134i may be used for subsequent formation of insulating layers 124. In some embodiments, stack structure 111 includes a first dielectric cap layer (not shown) on the top surface of stack structure 111. 3D memory device 100 may include a channel region for forming channel structures 110. The channel region may include a plurality of source regions 22 and a block region 21 between adjacent source regions 22.

Stack structure 111 may have a staircase structure. The staircase structure can be formed by repetitively etching a material stack that includes a plurality of interleaved sacrificial material layers and insulating material layers using an etch mask, e.g., a patterned PR layer over the material stack. The interleaved sacrificial material layers and the insulating material layers can be formed by alternatingly depositing layers of sacrificial material and layers of insulating material over substrate 102 until a desired number of layers is reached. The sacrificial material layers and insulating material layers can have the same or different thicknesses. In some embodiments, a sacrificial material layer and the underlying insulating material layer are referred to as a dielectric pair. In some embodiments, one or more dielectric pairs can form one level/staircase. During the formation of the staircase structure, the PR layer is trimmed (e.g., etched incrementally and inwardly from the boundary of the material stack, often from all directions) and used as the etch mask for etching the exposed portion of the material stack. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the sacrificial material layer and the underlying insulating material layer. The etched sacrificial material layers and insulating material layers may form initial sacrificial layers 133i and initial insulating layers 134i. The PR layer can then be removed.

The insulating material layers and sacrificial material layers may have different etching selectivities during the subsequent gate-replacement process. In some embodiments, the insulating material layers and the sacrificial material layers include different materials. In some embodiments, the insulating material layers include silicon oxide, and the deposition of insulating material layers include one or more of chemical vapor deposition (CVD), atomic layer deposition (ALD), physical vapor deposition (PVD), and sputtering. In some embodiments, the sacrificial material layers include silicon nitride, and the deposition of insulating material layers include one or more of CVD, PVD, ALD, and sputtering. In some embodiments, the etching of the sacrificial material layers and the insulating material layers include one or more suitable anisotropic etching process, e.g., dry etch.

A plurality of channel structures 110 can be formed in block region 21 before or after the formation of cut structure 114. Channel structures 110 may be formed before the formation of conductor layers 123. As an example, channel structures 110 are formed before the formation of cut structure 114. To form channel structures 110, a plurality of channel holes may be formed extending vertically through stack structure 111. In some embodiments, a plurality of channel holes are formed through the interleaved initial sacrificial layers 133$i$ and initial insulating layers 134$i$. The plurality of channel holes may be formed by performing an anisotropic etching process, using an etch mask such as a patterned PR layer, to remove portions of stack structure 111 and expose substrate 102. In some embodiments, at least one channel hole is formed on each side of cut structure 114 along the y-direction. In some embodiments, a plurality of channel holes are formed in each block region 21. A recess region may be formed at the bottom of each channel hole to expose a top portion of substrate 102 by the same etching process that forms the channel hole above substrate 102 and/or by a separate recess etching process. In some embodiments, a semiconductor plug is formed at the bottom of each channel hole, e.g., over the recess region. The semiconductor plug may be formed by an epitaxial growth process and/or a deposition process. In some embodiments, the semiconductor plug is formed by epitaxial growth and is referred to as the epitaxial portion. Optionally, a recess etch (e.g., dry etch and/or wet etch) may be performed to remove excess semiconductor material on the sidewall of the channel hole and/or control the top surface of the epitaxial portion at a desired position. In some embodiments, the top surface of the epitaxial portion is located between the top and bottom surfaces of the bottom initial insulating layer 134$i$.

In some embodiments, the channel holes are formed by performing a suitable etching process, e.g., an anisotropic etching process (e.g., dry etch) and/or an isotropic etching process (wet etch). In some embodiments, the epitaxial portion includes single crystalline silicon is formed by epitaxially grown from substrate 102. In some embodiments, the epitaxial portion includes polysilicon formed by a deposition process. The formation of epitaxially-grown epitaxial portion can include, but not limited to, vapor-phase epitaxy (VPE), liquid-phase epitaxy (LPE), molecular-beam epitaxy (MPE), or any combinations thereof. The formation of the deposited epitaxial portion may include, but not limited by, CVD, PVD, and/or ALD.

In some embodiments, a semiconductor channel is formed over and in contact with the epitaxial portion in the channel hole. Semiconductor channel can include a channel-forming structure that has a memory film (e.g., including a blocking layer, a memory layer, and a tunneling layer), a semiconductor layer formed above and connecting the epitaxial portion, and a dielectric core filling up the rest of the channel hole. In some embodiments, memory film is first deposited to cover the sidewall of the channel hole and the top surface of the epitaxial portion, and a semiconductor layer is then deposited over memory film and above epitaxial portion. The blocking layer, memory layer, and tunneling layer can be subsequently deposited in this order using one or more thin film deposition processes, such as ALD, CVD, PVD, any other suitable processes, or any combination thereof, to form memory film. The semiconductor layer can then be deposited on the tunneling layer using one or more thin film deposition processes, such as ALD, CVD, PVD, any other suitable processes, or any combination thereof. In some embodiments, a dielectric core is filled in the remaining space of the channel hole by depositing dielectric materials after the deposition of the semiconductor layer, such as silicon oxide.

In some embodiments, a drain structure is formed in the upper portion of each channel hole. In some embodiments, parts of memory film, semiconductor layer, and dielectric core on the top surface of stack structure 111 and in the upper portion of each channel hole can be removed by CMP, grinding, wet etching, and/or dry etching to form a recess in the upper portion of the channel hole so that a top surface of semiconductor channel may be between the top surface and the bottom surface of the first dielectric cap layer. Drain structure then can be formed by depositing conductive materials, such as metals, into the recess by one or more thin film deposition processes, such as CVD, PVD, ALD, electroplating, electroless plating, or any combination thereof. A channel structure 110 is thereby formed. A plurality of memory cells may subsequently be formed by the intersection of the semiconductor channels and the control conductor layers. Optionally, a planarization process, e.g., dry/wet etch and/or CMP, is performed to remove any excess material on the top surface of stack structure 111.

One or more cut openings may be formed in source region 22, separated from one another. Pattern 706 may be used for patterning the cut openings. A depth of a cut opening may be equal to thickness t of cut structure 114. In some embodiments, t is between the thicknesses of two initial sacrificial/insulating layer pairs and four initial sacrificial/insulating layer pairs. The value of t is determined based on design and/or fabrication of 3D memory device 100 and should not be limited by the embodiments of the present disclosure. In some embodiments, an anisotropic etching process, such as dry etch, is performed to remove a portion of stack structure 111 until a desired thickness t is reached. In some embodiments, one or more selective etching processes are used to remove the portion of stack structure 111 so the bottom surface of the cut opening can stop at a desired position (e.g., on a top surface of a desired initial insulating layer 134$i$ or initial sacrificial layer 133$i$) along the z-direction.

A suitable dielectric material, such as silicon oxide, is deposited to fill up the cut opening and form a respective cut structure 114. A suitable deposition process, such as CVD, ALD, PVD, sputtering, or a combination thereof, can be performed to deposit the dielectric material. In some embodiments, cut structure 114 is deposited by ALD. Optionally, a planarization process, e.g., CMP and/or recess etch, is performed to remove any excess material over stack structure 111.

Figure 3A:
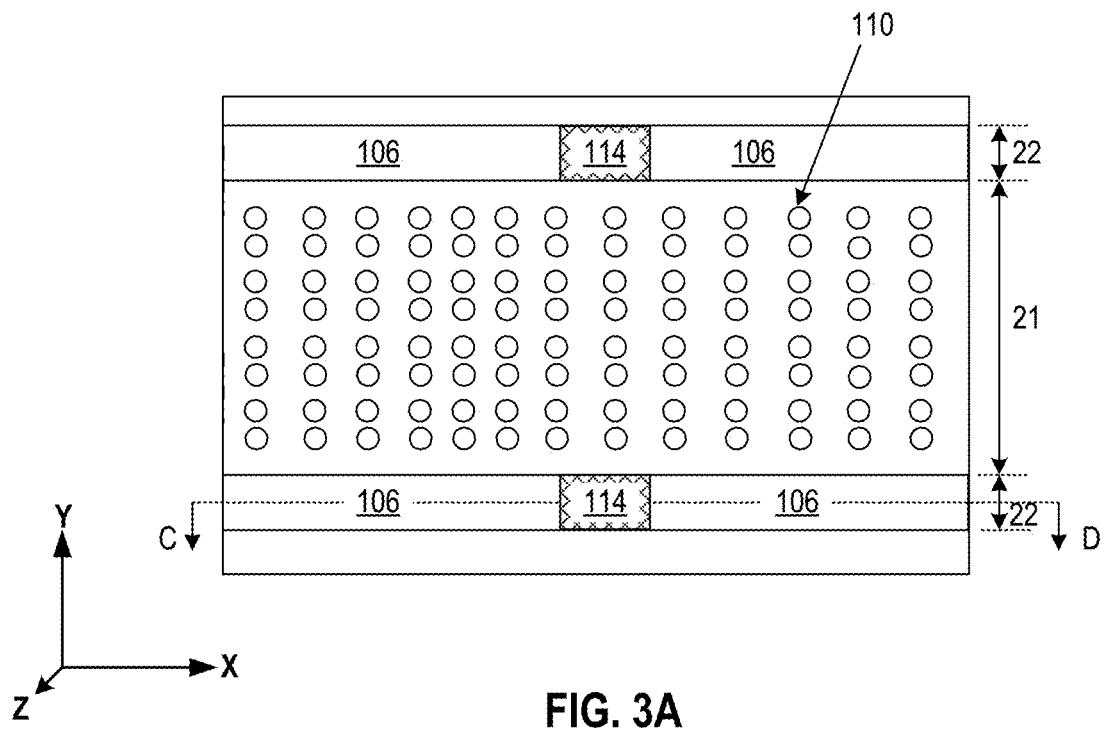
FIG. 3A illustrates a plan view of the exemplary 3D memory device at another stage of the fabrication process, according to some embodiments of the present disclosure.
Figure 3B:
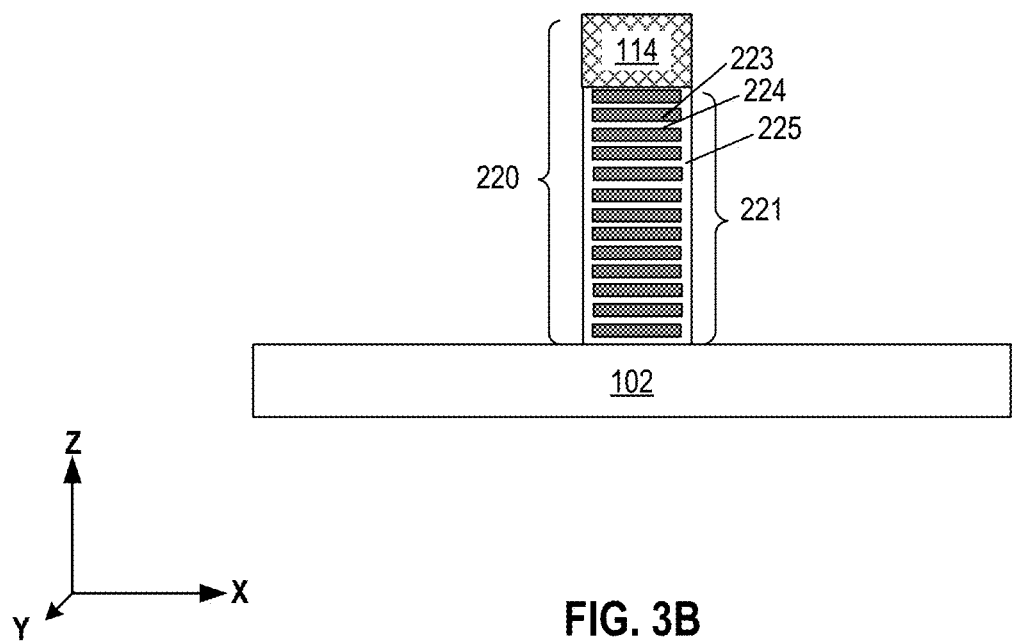
FIG. 3B illustrates a cross-sectional view of the 3D memory device illustrated in FIG. 3A along the C-D direction, according to some embodiments of the present disclosure.

Referring back to FIG. 9, after the formation of the cut structures, portions of the stack structure are removed to form a slit structure and at least one initial support structure dividing the slit structure into a plurality of slit opening (Operation 904). The at least one initial support structure each has a cut structure and interleaved a plurality of sacrificial portions and a plurality of insulating portions underneath the cut structure. FIGS. 3A and 3B illustrate a corresponding structure 300.

As shown in FIGS. 3A and 3B, portions of stack structure 111 in source region 22, exposed by cut structure 114 are removed to form a slit structure 106, which exposes substrate 102. Pattern 702 may be used for patterning slit structure 106. That is, portions of stack structure 111 in source region 22 and adjacent to cut structure 114 are removed to form slit structure 106. Cut structure 114 and the underneath interleaved sacrificial portions and insulating portions 224 (e.g., remaining portions of initial sacrificial layer 133i and initial insulating layer 134i after the etching of slit structure 106) may form an initial support structure. The sacrificial portions and insulating portions 224 may each be in contact with the sacrificial layers and insulating layers 124 of the same level in adjacent block regions 21. One or more initial support structures may divide slit structure 106 into a plurality of slit openings, each exposing substrate 102 and interleaved sacrificial layers and insulating layers of adjacent block regions 21. Depending on the fabrication process, along the y-direction, a width d3 of cut structure 114 may be less than, equal to, or greater than a width d4 of slit structure 106. A suitable anisotropic etching process, e.g., dry etch, can be performed to form slit structure 106.

In some embodiments, pattern 702 may not be used for patterning slit structure 106 and cut structure 114 may be used as an etch mask to remove portions of stack structure 111 and form slit structure 106. In this case, the width of cut structure 114 may be greater than or equal to the width of slit structure 106.

Referring back to FIG. 9, after the formation of the initial support structure, the sacrificial portions in each initial support structure and the sacrificial layers in each block region are replaced with conductor portions and conductor layers, forming at least one support structure and a plurality of memory blocks (Operation 906). FIGS. 3A and 3B illustrate a corresponding structure 300.

As shown in FIGS. 3A and 3B, the sacrificial portions in each initial support structure are replaced with a plurality of conductor portions 223. The sacrificial layers in each block region 21 are replaced with a plurality of conductor layers 123 (referring back to FIG. 1C). An isotropic etching process, e.g., wet etch, can be performed to remove the sacrificial portions and sacrificial layers through slit structures 106. A plurality of lateral recesses may be formed in each block region 21 by the removal of the sacrificial layers, and a plurality of recess portions may be formed in each initial support structure by the removal of the sacrificial portions. A conductor material may then be deposited to fill up the lateral recesses and recess portions, forming the plurality of conductor layers 123 in each block region and the plurality of conductor portions 223 in each initial support structure. Accordingly, portion stack 221, having a plurality of interleaved conductor portions 223 and insulating portions 224, may be formed. Support structure 220, having cut structure 114 and portion stack 221 underneath, may be formed. Optionally, a spacer layer 225 is formed to surround interleaved conductor portions 223 and insulating portions 224, further isolating conductor portions 223 from the subsequently-formed source structure. In some embodiments, when spacer layer 225 is not formed, the insulating structures of source contacts 104 provide electrical insulation between source contacts 104 and conductor portions 223. In some embodiments, the conductor material and spacer layer 225 is each deposited by at least one of CVD, PVD, ALD, and sputtering.

Figure 4A:
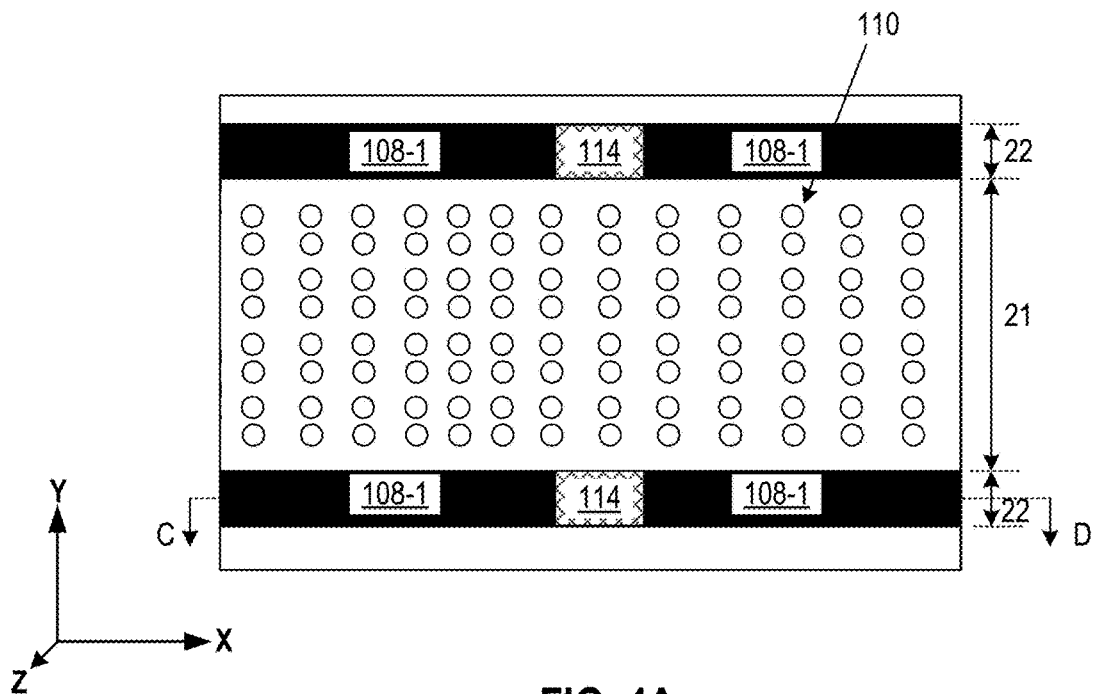
FIG. 4A illustrates a plan view of the exemplary 3D memory device at another stage of the fabrication process, according to some embodiments of the present disclosure.
Figure 4B:
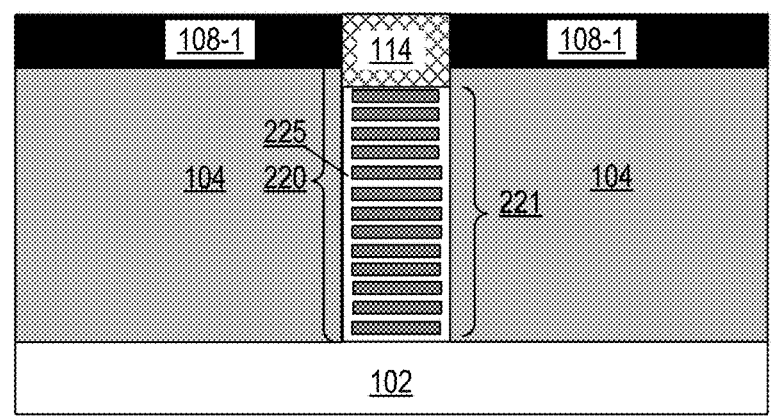
FIG. 4B illustrates a cross-sectional view of the 3D memory device illustrated in FIG. 4A along the C-D direction, according to some embodiments of the present disclosure.

Referring back to FIG. 9, after the formation of the support structure and conductor layers, a source structure is formed in the slit structure and a first portion of a connection layer is formed on each source contact of the source structure (Operation 908). FIGS. 4A and 4B illustrate a corresponding structure 400.

As shown in FIGS. 4A and 4B, a source structure is formed in slit structure 106. The source structure may include an insulating structure in each slit opening of slit structure 106 and a source contact 104 in each insulating structure. Optionally, an adhesion layer (not shown) is deposited over the top surface and/or sidewalls of support structure 220 before the formation of the source structure. In some embodiments, the insulating structure includes silicon oxide and source contacts 104 include polysilicon. The insulating structure and source contacts 104 may each be deposited by one or more of CVD, PVD, ALD, and sputtering. A recess etching process may be performed on the insulating structure to expose substrate 102 so the respective source contact 104 can be in contact with substrate 102. Optionally, a recess etching process, dry and/or wet etch, is performed to remove the excess material of source contact 104 before the deposition of the adhesion layer. In some embodiments, the adhesion layer includes TiN and is deposited by one or more of CVD, PVD, ALD, electroplating, and sputtering. In some embodiments, top surfaces of source contacts 104 may be lower than a top surface of support structure 220 (or cut structure 114 in this operation). Optionally, a recess etching process may be performed to etch back source contacts 104 to form sufficient space in slit structure 106 for the formation of connection layer 108.

In some embodiments, a conductive material is deposited over source contacts 104 to fill up slit structure 106, forming a first portion 108-1 of connection layer 108 over a respective source contact 104. First portion 108-1 may partially or fully cover the respective source contact 104. Optionally, an adhesion layer (not shown) is deposited over the top surface of source contacts 104 before the formation of first portion 108-1 of connection layer 108. In some embodiments, the conductive material includes one or more of tungsten, aluminum, copper, cobalt, polysilicon, and silicides. In some embodiments, source contacts 104 includes polysilicon and first portions 108-1 of connection layer 108 include tungsten. Optionally, a planarization process, e.g., CMP and/or recess etch, is performed to remove any excess material over first portions 108-1 of connection layer 108 and support structures 220. In some embodiments, the top surfaces of support structures 220 and first portions 108-1 of connection layer 108 may be coplanar in the x-y plane.

Figure 5A:
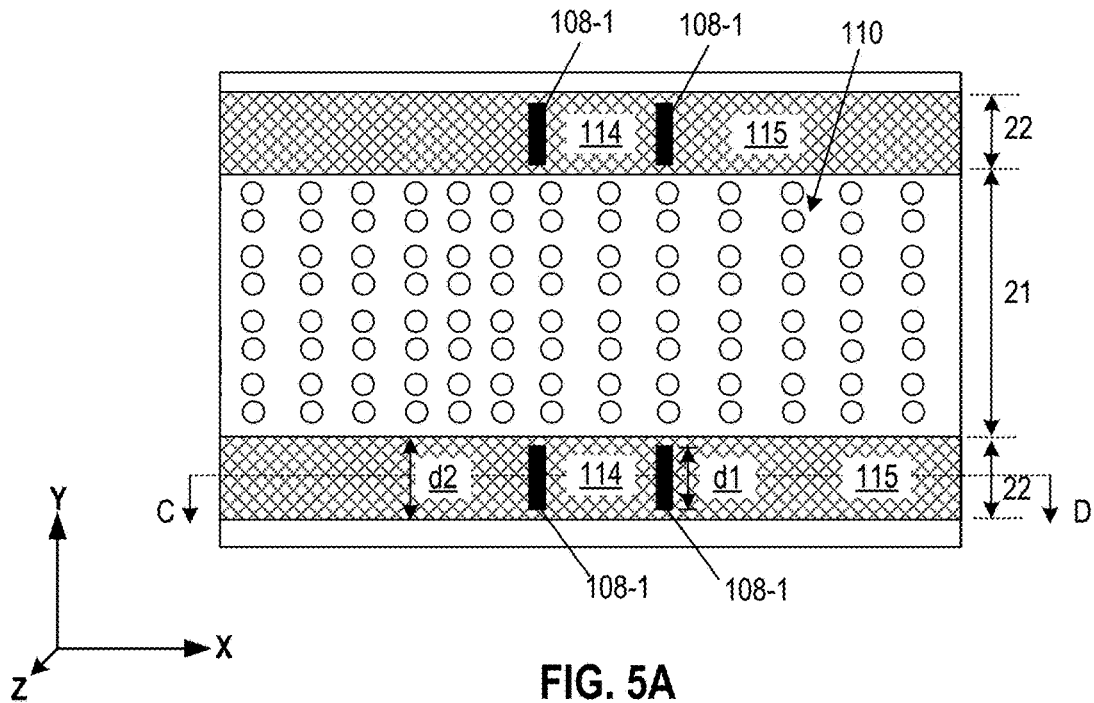
FIG. 5A illustrates a plan view of the exemplary 3D memory device at another stage of the fabrication process, according to some embodiments of the present disclosure.
Figure 5B:
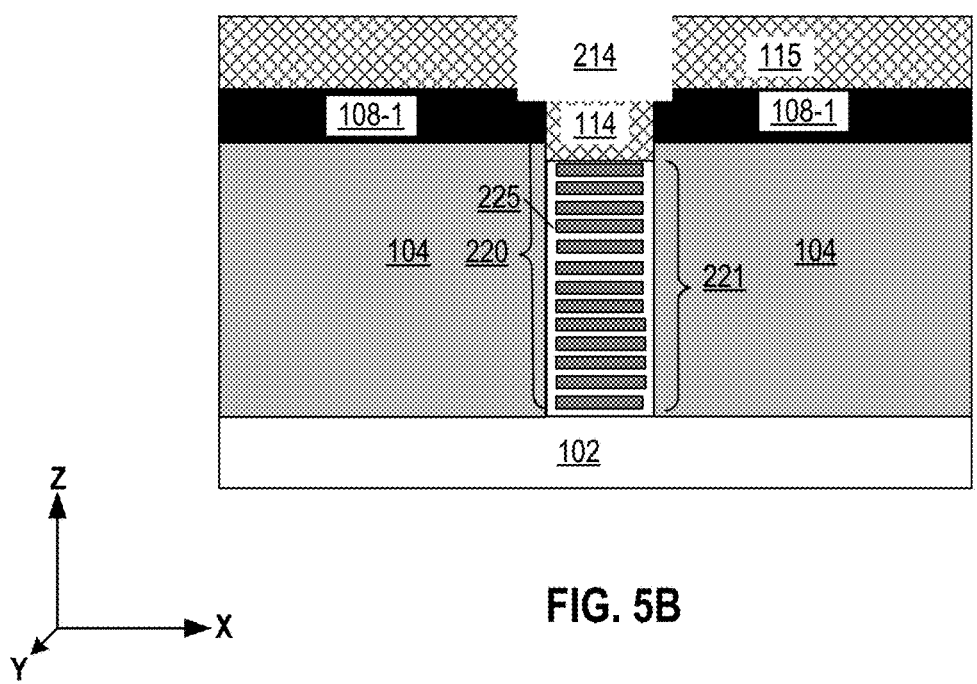
FIG. 5B illustrates a cross-sectional view of the 3D memory device illustrated in FIG. 5A along the C-D direction, according to some embodiments of the present disclosure.

Referring back to FIG. 9, after the formation of the source structure and the first portions of the connection layer, a dielectric cap layer is formed over the source structure to expose at least two adjacent first portions of the connection layer (Operation 910). FIGS. 5A and 5B illustrate a corresponding structure 500.

As shown in FIGS. 5A and 5B, a dielectric cap layer 115 is formed over each source structure to expose at least a pair of two adjacent first portions 108-1 of connection layer 108. In some embodiments, dielectric cap layer 115 also covers at least a portion of block region 21. In some embodiments, dielectric cap layer 115 covers all channel structures 110 in block region 21. Dielectric cap layer 115 may include at least one opening 214 that exposes the at least one pair of two adjacent first portions 108-1 of connection layer 108. In some embodiments, opening 214 also exposes cut structure 114. Pattern 704 may be used for patterning opening 214. The area covered by dielectric cap layer 115 may be determined based on the coverage of the subsequently-formed second portions 108-2 of connection layer 108. In some embodiments, the area covered by dielectric cap layer 115 may be greater than the area of second portions 108-2 of connection layer 108 along the x-y plane to insulate connection layer 108 from other parts of stack structure 111 except for source contacts 104. For example, along the y-direction, width d2 of dielectric cap layer 115 is greater than width d1 of first portions 108-1 of connection layer 108

(or the width of opening 214). In some embodiments, dielectric cap layer 115 may partially cover block region 21.

Dielectric cap layer 115 may be formed by depositing a suitable dielectric material such as silicon oxide to cover first portions 108-1 and support structures 220. Dielectric cap layer 115 may be deposited by one or more of CVD, PVD, ALD, and sputtering. The deposited dielectric material may then be patterned to form opening 214 that exposes at least one pair of adjacent first portions 108-1 of connection layer 108. In some embodiments, opening 214 may also expose the support structure 220 (or cut structure 114) between the pair of adjacent first portions 108-1. Depending on the depth of opening 214, cut structure 114 may be partially removed as the formation of opening 214. In some embodiments, dielectric cap layer 115 exposes all the support structures 220 and all pairs of adjacent first portions 108-1 of connection layer 108.

Figure 6A:
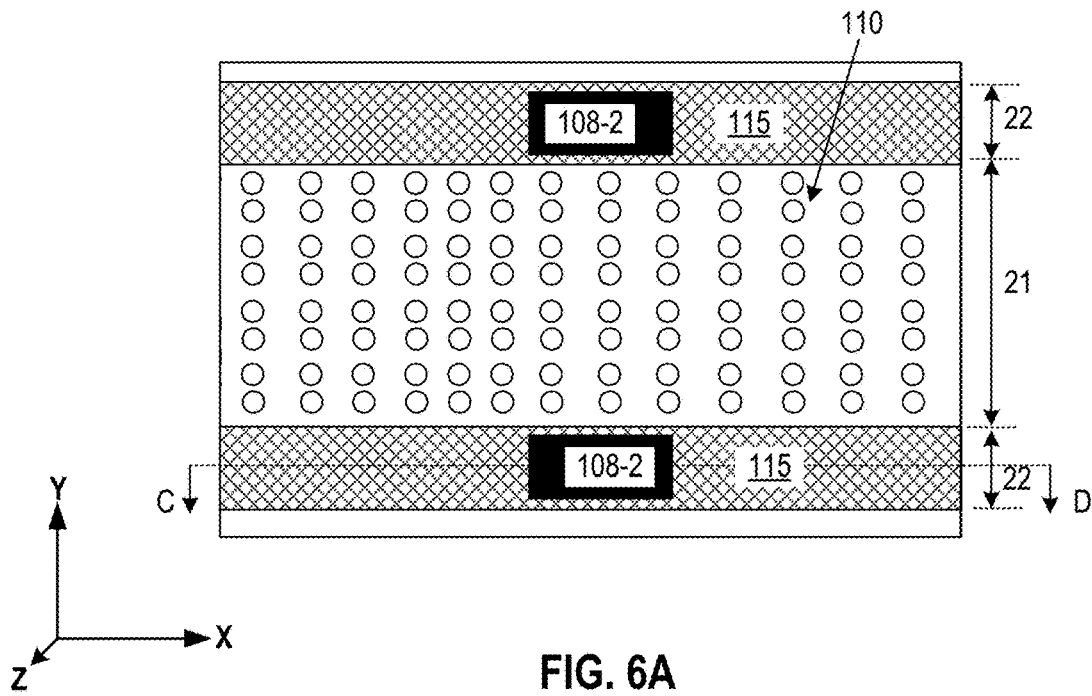
FIG. 6A illustrates a plan view of the exemplary 3D memory device at another stage of the fabrication process, according to some embodiments of the present disclosure.
Figure 6B:
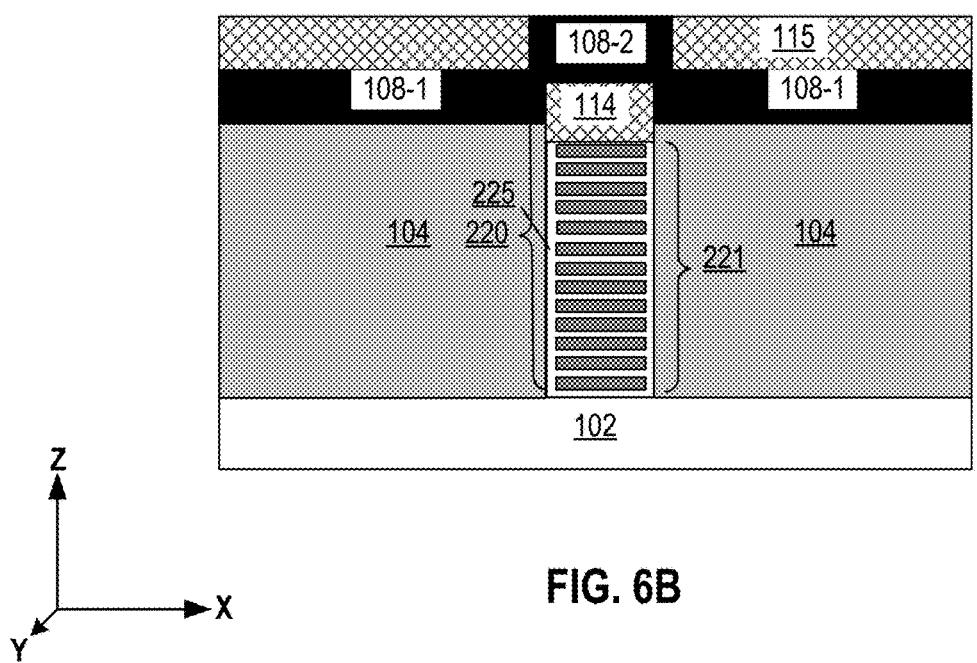
FIG. 6B illustrates a cross-sectional view of the 3D memory device illustrated in FIG. 6A along the C-D direction, according to some embodiments of the present disclosure.

Referring back to FIG. 9, after the formation of the dielectric cap layer, a second portion of the connection layer is formed in the dielectric cap layer to be in contact with and conductively connected to a pair of adjacent first portions of the connection layer (Operation 912). FIGS. 6A and 6B illustrate corresponding structure 600.

As shown in FIGS. 6A and 6B, a second portion 108-2 of connection layer 108 is formed in dielectric cap layer 115. The second portion 108-2 of connection layer 108 may be in contact with and conductively connected to the exposed pair of two adjacent first portions 108-1 of connection layer 108, forming connection layer 108. The pair of two adjacent first portions 108-1 of connection layer 108 may be distributed on both sides of support structure 220 between the two adjacent first portions 108-1 of connection layer 108. In some embodiments, a plurality of second portions 108-2 of connection layer 108 are formed in a plurality of openings 214 to be in contact with and conductively connected to a plurality of pairs, e.g., all pairs, of adjacent first portions 108-1 of connection layer 108. Second portion 108-2 of connection layer 108 may be formed by depositing a suitable conductive material that fills up opening 214. The conductive material may fully or partially cover cut structure 114 underneath and the exposed portions of the pair of adjacent first portions 108-1 of connection layer 108. The conductive material may include one or more of tungsten, aluminum, copper, cobalt, polysilicon, and silicides. In some embodiments, the conductive material includes tungsten and is deposited by one or more of CVD, PVD, ALD, and sputtering. Optionally, a planarization process, e.g., CMP and/or recess etch, is performed to remove any excess material over second portion 108-2 of connection layer 108.

In some embodiments, a 3D memory device includes a memory stack, a plurality of channel structures, and a source structure. The memory stack is over a substrate and includes interleaved a plurality of conductor layers and a plurality of insulating layers. The plurality of channel structures extend vertically in the memory stack. The source structure extend in the memory stack. The source structure includes a plurality of source contacts each in a respective insulating structure, and two adjacent ones of the plurality of source contacts are conductively connected to one another.

In some embodiments, the two adjacent ones of the plurality of source contacts are in contact with and conductively connected to one another by a connection layer. The connection layer may be a conductive layer and in contact with each of the two adjacent ones of the plurality of source contacts.

In some embodiments, the connection layer includes at least one of tungsten, cobalt, aluminum, copper, silicides, or polysilicon.

In some embodiments, the connection layer is positioned over each of the two adjacent ones of the plurality of source contacts.

In some embodiments, the 3D memory device further includes a cap layer over the source structure. The cap layer may cover a pair of first portions of the connection layer that are over the two adjacent ones of the plurality of source contacts and expose a second portion of the connection layer that is between the two adjacent ones of the plurality of source contacts.

In some embodiments, the connection layer is over and in contact with each of the plurality of source contacts.

In some embodiments, along a lateral direction perpendicular to another lateral direction along which the source structure extends, a width of the connection layer is equal to or less than a width of the source structure.

In some embodiments, the source structure further includes a support structure between the two adjacent ones of the plurality of source contacts and covered by the connection layer. The support structure may be in contact with memory blocks adjacent to the source structure.

In some embodiments, a top surface of the support structure is higher than top surfaces of the two adjacent ones of the plurality of source contacts along a vertical direction, and a top surface of the second portion of the connection layer is higher than top surfaces of the pair of first portions of the connection layer along the vertical direction.

In some embodiments, the support structure includes a cut structure over interleaved a plurality of conductor portions and a plurality of insulating portions. Each of the plurality of conductor portions may be in contact with corresponding conductor layers in the memory blocks adjacent to the source structure. Each of the plurality of insulating portions may be in contact with corresponding insulating layers in the memory blocks adjacent to the source structure.

In some embodiments, the support structure includes a spacer layer in contact with and surrounding the interleaved plurality of conductor portions and insulating portions.

In some embodiments, the cut structure includes silicon oxide.

In some embodiments, a thickness of the cut structure is between interleaved two conductor layers and two insulating layers and interleaved four conductor layers and four insulating layers. In some embodiments, along a lateral direction perpendicular to another lateral direction along which the source structure extends, a width of the cut structure is equal to or less than a width of the source structure.

In some embodiments, the plurality of source contacts include at least one of cobalt, aluminum, copper, silicides, or polysilicon.

In some embodiments, the 3D memory device further includes an adhesion layer between insulating structures of the at least two adjacent ones of the plurality of source contacts and the support structure, and between the at least two adjacent ones of the plurality of source contacts and the connection layer.

In some embodiments, the adhesion layer includes titanium nitride.

In some embodiments, the plurality of channel structures each includes an epitaxial portion in contact with and conductively connected to the substrate, a semiconductor channel in contact with and conductively connected to the epitaxial portion, and a drain structure in contact with and conductively connected to the semiconductor channel.

In some embodiments, a 3D memory device includes a memory stack, a plurality of channel structures, and a plurality of source structures. The memory stack is over a substrate and includes interleaved a plurality of conductor layers and a plurality of insulating layers. The plurality of channel structures extend vertically in the memory stack. The plurality of source structures extend in parallel along a lateral direction in the memory stack. The plurality of source structures each includes a plurality of source contacts each in a respective insulating structure, a plurality of support structures each in contact with adjacent insulating structures along the lateral direction, and a connection layer conductively connected to at least two adjacent ones of the plurality of source contacts.

In some embodiments, the connection layer includes at least one of tungsten, cobalt, aluminum, copper, silicides, or polysilicon.

In some embodiments, the connection layer is positioned over and in contact with each of the at least two adjacent ones of the plurality of source contacts.

In some embodiments, the 3D memory device further includes a cap layer over the at least two adjacent ones of the plurality of source contacts. The cap layer may cover a plurality of first portions of the connection layer that are over the at least two adjacent ones of the plurality of source contacts and expose a second portion of the connection layer that is between the at least two adjacent ones of the plurality of source contacts.

In some embodiments, the connection layer is over and in contact with each of the plurality of respective source contacts.

In some embodiments, along another lateral direction perpendicular to the lateral direction, a width of the connection layer is equal to or less than a width of the respective source structure.

In some embodiments, the plurality of support structures each includes a cut structure over interleaved a plurality of conductor portions and a plurality of insulating portions. Each of the plurality of conductor portions may be in contact with corresponding conductor layers in the memory blocks adjacent to the respective source structure. Each of the plurality of insulating portions may be in contact with corresponding insulating layers in the memory blocks adjacent to the respective source structure.

In some embodiments, a top surface of each of the plurality of support structures is higher than top surfaces of the at least two adjacent ones of the plurality of source contacts along a vertical direction. In some embodiments, a top surface of the second portion of the connection layer is higher than top surfaces of the pair of first portions of the connection layer along the vertical direction.

In some embodiments, the cut structure includes silicon oxide.

In some embodiments, a thickness of the cut structure is between interleaved two conductor layers and two insulating layers and interleaved four conductor layers and four insulating layers. In some embodiments, along a lateral direction perpendicular to another lateral direction along which the respective source structure extends, a width of the cut structure is equal to or less than a width of the respective source structure.

In some embodiments, the plurality of source contacts include at least one of cobalt, aluminum, copper, silicides, or polysilicon.

In some embodiments, the 3D memory device further includes an adhesion layer between the at least two adjacent ones of the plurality of source contacts and the connection layer and between the at least two adjacent ones of the plurality of source contacts and the support structure.

In some embodiments, the adhesion layer includes titanium nitride.

In some embodiments, the plurality of channel structures each includes an epitaxial portion in contact with and conductively connected to the substrate, a semiconductor channel in contact with and conductively connected to the epitaxial portion, and a drain structure in contact with and conductively connected to the semiconductor channel.

In some embodiments, a method for forming a 3D memory device includes the following operations. First, a cut structure is formed in a stack structure, the stack structure including interleaved a plurality of initial sacrificial layers and a plurality of initial insulating layers. Portions of the stack structure adjacent to the cut structure are removed to form a slit structure and an initial support structure, the initial support structure dividing the slit structure into a plurality of slit openings. A plurality of conductor portions are formed through the plurality of slit openings to form a support structure. A source contact is formed in each of the plurality of slit openings. A pair of first portions of a connection layer are formed in contact with and conductively connected to source contacts in adjacent ones of the plurality of slit openings. A second portion of the connection layer is formed in contact with and conductively to the pair of first portions of the connection layer.

In some embodiments, the method further includes forming a cap layer over and exposing the pair of first portions of the connection layer before forming the second portion of the connection layer, such that the second portion is in contact with and conductively connected to the pair of first portions through the cap layer.

In some embodiments, forming the cap layer includes depositing a cap material layer to cover the pair of first portions of the connection layer and removing a portion of the cap material layer to expose the cut structure and the pair of first portions of the connection layer.

In some embodiments, forming the pair of first portions of the connection layer includes depositing a conductive material over the source contacts in adjacent ones of the plurality of slit openings and forming the second portion of the connection layers includes depositing the conductive material to fill up the removed portions of the cap layer.

In some embodiments, the method further includes depositing an adhesion layer between the pairs of first portions of the connection layer and the cap material layer.

In some embodiments, forming the cut structure includes forming a cut opening in the stack structure and depositing a dielectric material to fill up the cut opening.

In some embodiments, removing the portions of the stack structure adjacent to the cut structure to form a slit structure and an initial support structure includes removing portions of the stack structure adjacent to the cut structure along a lateral direction to form the slit structure that exposes the substrate, such that the cut structure and interleaved a plurality of sacrificial portions and a plurality of insulating portions form the initial support structure.

In some embodiments, forming the plurality of conductor portions includes removing, through the plurality of slit openings, the plurality of sacrificial portions in the support structure to form a plurality recess portions. In some embodiments, forming the plurality of conductor portions also includes depositing a conductor material to fill up the plurality of recess portions to form the plurality of conductor portions.

In some embodiments, the method further includes forming a plurality of conductor layers in a plurality of block portions of the stack structure in the same operations that form the plurality of conductor portions, such that the plurality of block portions is in contact with the initial support structure, wherein the plurality of conductor layers are formed by removing, through the plurality of slit openings, a plurality of sacrificial layers in the plurality of block portions to form a plurality of lateral recesses, and depositing the conductor material to fill up the plurality of lateral recesses to form the plurality of conductor layers.

In some embodiments, forming the source contact includes depositing at least one of cobalt, aluminum, copper, silicides, or polysilicon to fill up the respective slit opening.

In some embodiments, the method further includes forming an insulating structure in the slit opening before the source contact, such that the insulating structure exposes the substrate and depositing another adhesion layer between the insulating structure and the support structure.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack over a substrate, the memory stack comprising interleaved a plurality of conductor layers and a plurality of insulating layers;
   a plurality of channel structures extending vertically in the memory stack; and
   a source structure extending in the memory stack, wherein the source structure comprises a plurality of source contacts each in a respective insulating structure, and
   two adjacent ones of the plurality of source contacts are conductively connected to one another.

2. The 3D memory device of claim 1, wherein the two adjacent ones of the plurality of source contacts are in contact with and conductively connected to one another by a connection layer, the connection layer being a conductive layer and in contact with each of the two adjacent ones of the plurality of source contacts.

3. The 3D memory device of claim 2, wherein the connection layer comprises at least one of tungsten, cobalt, aluminum, copper, silicides, or polysilicon.

4. The 3D memory device of claim 2, wherein the connection layer is positioned over each of the two adjacent ones of the plurality of source contacts.

5. The 3D memory device of claim 4, further comprising a cap layer over the source structure, wherein the cap layer covers a pair of first portions of the connection layer that are over the two adjacent ones of the plurality of source contacts and exposes a second portion of the connection layer that is between the two adjacent ones of the plurality of source contacts.

6. The 3D memory device of claim 5, wherein the connection layer is over and in contact with each of the plurality of source contacts.

7. The 3D memory device of claim 6, wherein the source structure further comprises a support structure between the two adjacent ones of the plurality of source contacts and covered by the connection layer, and wherein:
   the support structure is in contact with memory blocks adjacent to the source structure;
   a top surface of the support structure is higher than top surfaces of the two adjacent ones of the plurality of source contacts along a vertical direction; and
   a top surface of the second portion of the connection layer is higher than top surfaces of the pair of first portions of the connection layer along the vertical direction.

8. The 3D memory device of claim 7, wherein the support structure comprises a cut structure over interleaved a plurality of conductor portions and a plurality of insulating portions, each of the plurality of conductor portions being in contact with corresponding conductor layers in the memory blocks adjacent to the source structure, each of the plurality of insulating portions being in contact with corresponding insulating layers in the memory blocks adjacent to the source structure.

9. The 3D memory device of claim 8, wherein the cut structure comprises silicon oxide.

10. A three-dimensional (3D) memory device, comprising:
    a memory stack over a substrate, the memory stack comprising interleaved a plurality of conductor layers and a plurality of insulating layers;
    a plurality of channel structures extending vertically in the memory stack; and
    a plurality of source structures extending in parallel along a lateral direction in the memory stack, wherein the plurality of source structures each comprises:
       a plurality of source contacts each in a respective insulating structure,
       a plurality of support structures each in contact with adjacent insulating structures along the lateral direction, and
       a connection layer conductively connected to at least two adjacent ones of the plurality of source contacts.

11. The 3D memory device of claim 10, wherein the connection layer is positioned over and in contact with each of the at least two adjacent ones of the plurality of source contacts.

12. The 3D memory device of claim 10, wherein the connection layer comprises at least one of tungsten, cobalt, aluminum, copper, silicides, or polysilicon.

13. The 3D memory device of claim 12, further comprising a cap layer over the at least two adjacent ones of the plurality of source contacts, wherein
the cap layer covers a plurality of first portions of the connection layer that are over the at least two adjacent ones of the plurality of source contacts and
exposes a second portion of the connection layer that is between the at least two adjacent ones of the plurality of source contacts.

14. The 3D memory device of claim 13, wherein the plurality of support structures each comprises a cut structure over interleaved a plurality of conductor portions and a plurality of insulating portions, each of the plurality of conductor portions being in contact with corresponding conductor layers in memory blocks adjacent to the respective source structure, each of the plurality of insulating portions being in contact with corresponding insulating layers in the memory blocks adjacent to the respective source structure.

15. The 3D memory device of claim 14, wherein
a top surface of each of the plurality of support structures is higher than top surfaces of the at least two adjacent ones of the plurality of source contacts along a vertical direction; and
a top surface of the second portion of the connection layer is higher than top surfaces of the pair of first portions of the connection layer along the vertical direction.

16. A method for forming a three-dimensional (3D) memory device, comprising:
forming a cut structure in a stack structure, the stack structure comprising interleaved a plurality of initial sacrificial layers and a plurality of initial insulating layers;
removing portions of the stack structure adjacent to the cut structure to form a slit structure and an initial support structure, the initial support structure dividing the slit structure into a plurality of slit openings;
forming a plurality of conductor portions through the plurality of slit openings to form a support structure;
forming a source contact in each of the plurality of slit openings;
forming a pair of first portions of a connection layer in contact with and conductively connected to source contacts in adjacent ones of the plurality of slit openings; and
forming a second portion of the connection layer in contact with and conductively to the pair of first portions of the connection layer.

17. The method of claim 16, further comprising forming a cap layer over and exposing the pair of first portions of the connection layer before forming the second portion of the connection layer, such that the second portion is in contact with and conductively connected to the pair of first portions through the cap layer.

18. The method of claim 17, wherein forming the cap layer comprises:
depositing a cap material layer to cover the pair of first portions of the connection layer; and
removing a portion of the cap material layer to expose the cut structure and the pair of first portions of the connection layer.

19. The method of claim 18, wherein
forming the pair of first portions of the connection layer comprises depositing a conductive material over the source contacts in adjacent ones of the plurality of slit openings; and
forming the second portion of the connection layer comprises depositing the conductive material to fill up the removed portions of the cap material layer.

20. The method of claim 16, wherein
forming the cut structure comprises:
forming a cut opening in the stack structure; and
depositing a dielectric material to fill up the cut opening, and
removing the portions of the stack structure adjacent to the cut structure to form a slit structure and an initial support structure comprises:
removing portions of the stack structure adjacent to the cut structure along a lateral direction to form the slit structure that exposes a substrate, such that the cut structure and interleaved a plurality of sacrificial portions and a plurality of insulating portions form the initial support structure.

* * * * *